(12) United States Patent
Lee

(10) Patent No.: US 6,777,685 B2
(45) Date of Patent: Aug. 17, 2004

(54) IMAGING ARRAY AND METHODS FOR FABRICATING SAME

(75) Inventor: Ji Ung Lee, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 126 days.

(21) Appl. No.: 10/116,185

(22) Filed: Apr. 3, 2002

(65) Prior Publication Data

US 2003/0201396 A1 Oct. 30, 2003

(51) Int. Cl.[7] ............................................. H01L 27/146
(52) U.S. Cl. .................................. 250/370.09; 257/291
(58) Field of Search ...................... 250/370.09, 370.08, 250/580, 374, 370.11, 370.13, 370.14, 338.4, 208.1, 214.1; 257/291, 386, 389

(56) References Cited

U.S. PATENT DOCUMENTS

| | | | |
|---|---|---|---|
| 4,725,890 A | 2/1988 | Yaniv et al. | |
| 4,739,414 A | 4/1988 | Pryor et al. | |
| 4,889,983 A | 12/1989 | Numano et al. | |
| 5,202,575 A | 4/1993 | Sakai | |
| 5,349,174 A | * 9/1994 | Van Berkel et al. | 250/208.1 |
| 5,399,884 A | 3/1995 | Wei et al. | |
| 5,435,608 A | 7/1995 | Wei et al. | |
| 5,480,810 A | 1/1996 | Wei et al. | |
| 5,532,180 A | 7/1996 | den Boer et al. | |
| 5,587,591 A | 12/1996 | Kingsley et al. | |
| 5,610,403 A | 3/1997 | Kingsley et al. | |
| 5,610,404 A | 3/1997 | Possin | |
| 5,614,727 A | 3/1997 | Mauri et al. | |
| 5,631,473 A | 5/1997 | Possin et al. | |
| 5,648,654 A | 7/1997 | Possin | |
| 5,736,732 A | 4/1998 | Possin et al. | |
| 5,777,355 A | 7/1998 | Possin et al. | |
| 5,818,053 A | 10/1998 | Tran | |
| 5,838,054 A | 11/1998 | Kwasnick et al. | |
| 5,869,837 A | 2/1999 | Huang | |
| 5,920,070 A | 7/1999 | Petrick et al. | |
| 5,942,756 A | 8/1999 | Tran | |
| 6,025,599 A | 2/2000 | Lee et al. | |
| 6,031,234 A | 2/2000 | Albagli et al. | |
| 6,075,248 A | * 6/2000 | Jeromin et al. | 250/370.09 |
| 6,124,606 A | * 9/2000 | den Boer et al. | 257/291 |
| 6,133,614 A | 10/2000 | Shoji et al. | |
| 6,167,110 A | 12/2000 | Possin et al. | |
| 6,243,441 B1 | 6/2001 | Zur | |
| 6,262,421 B1 | 7/2001 | Tran | |
| 6,490,014 B1 | * 12/2002 | Ohtani et al. | 349/38 |
| 6,559,506 B1 | * 5/2003 | Lee et al. | 257/350 |

* cited by examiner

*Primary Examiner*—Constantine Hannaher
*Assistant Examiner*—Otilia Gabor
(74) *Attorney, Agent, or Firm*—Armstrong Teasdale LLP

(57) ABSTRACT

A radiation detector includes a top-gate thin film transistor (TFT) including a source electrode, a drain electrode, and a gate electrode, and a diode electrically coupled to the source electrode.

20 Claims, 4 Drawing Sheets

IMAGING ARRAY AND METHODS FOR FABRICATING SAME

BACKGROUND OF THE INVENTION

This invention relates generally to imaging arrays, and more particularly, to pixel formations for imaging arrays.

Imaging arrays typically include a photosensor array coupled to a scintillating medium. Radiation absorbed in the scintillator generates optical photons which in turn pass into a photosensor, such as a photodiode. The photon is absorbed in the photosensor and an electrical signal corresponding to an incident photon flux is generated. Hydrogenated amorphous silicon (a-Si:H) is commonly used in the fabrication of photosensors due to advantageous photoelectric characteristics of a-Si:H and a relative ease of fabricating such devices. In particular, a plurality of photosensitive elements, such as photodiodes, can be formed in connection with any necessary control or switching elements, such as a thin film transistor (TFT), in a relatively large array. Radiation detectors and display arrays are typically fabricated on a large substrate on which many components, including TFTs, address lines, capacitors, and devices such as photosensors, are formed through the deposition and patterning of layers of conductive, semiconductive, and insulative materials.

At least one known fabrication process for such a TFT array typically includes fabricating a bottom gate TFT and a plurality of data and scan address lines. In some known bottom gate TFTs, the bottom gate metal shields a channel region, i.e. acts as a light blocking element, blocking light from a back light. The light blocking layer is desirable since photons can create an undesirable leakage in the TFT. For example, in a digital X-ray panel, the light is created from the scintillator that is deposited on the top of the devices, therefore the TFT regions are directly exposed to the photons. Therefore, an additional light blocking layer, requiring an additional photolithography level, is therefore necessary to shield the TFT channel region from undesirable light.

BRIEF SUMMARY OF THE INVENTION

In one aspect, a radiation detector is provided. The radiation detector includes a top-gate thin film transistor (TFT) including a source electrode, a drain electrode, and a gate electrode, and a diode electrically coupled to the source electrode.

In another aspect, an imaging system including a radiation source and a radiation detector positioned to receive radiation from the radiation source is provided. The radiation detector includes a top-gate thin film transistor (TFT) including a source electrode, a drain electrode, and a gate electrode, and a diode electrically coupled to the source electrode a top-gate thin film transistor.

In a further aspect, a method for fabricating an imaging array is provided. The method includes forming a top-gate thin film transistor (TFT) including a source electrode, a drain electrode, and a gate electrode, and forming a diode electrically coupled to the source electrode a top-gate thin film transistor.

DETAILED DESCRIPTION OF THE INVENTION

Figure 1:
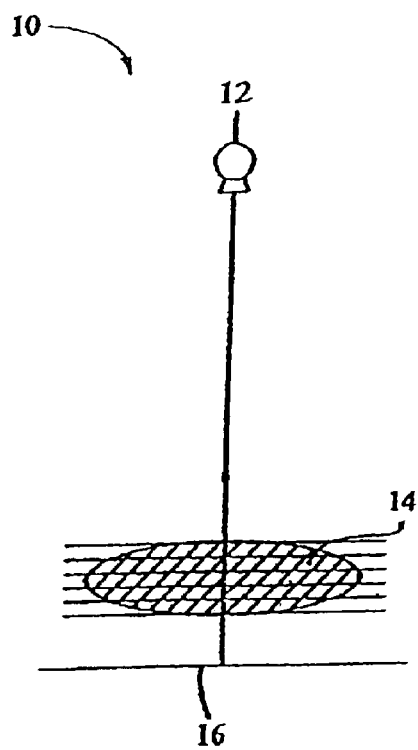
FIG. 1 is a prior art pictorial view of an imaging system.

FIG. 1 is a pictorial view of an imaging system 10. In one embodiment imaging system 10 is a medical imaging system, such as, but not limited to, a Sennovision 2000D which is commercially available from GE Medical Systems, Milwaukee, Wis. Imaging system 10 includes a radiation source 12 which projects a cone-shaped beam. In one embodiment, radiation source 12 is an x-ray source 12, and the cone-shaped beam is an x-ray beam. The X-ray beam passes through an object 14, i.e. an object being imaged such as a patient. The X-ray beam, after being attenuated by object 14, impinges upon radiation detector 16.

Figure 2:
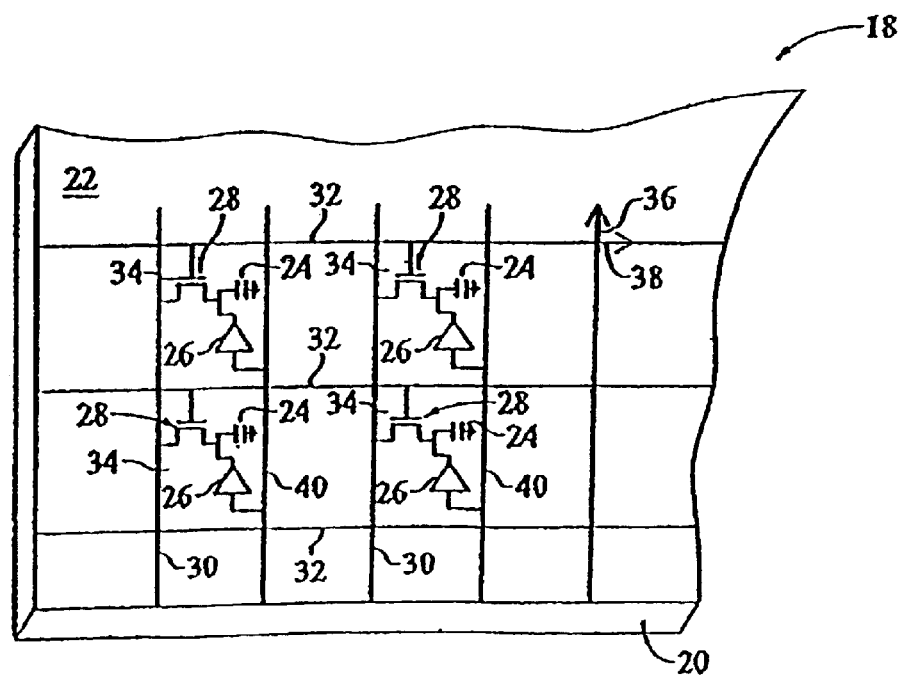
FIG. 2 is schematic illustration of a representative pixel in a photosensor array.

FIG. 2 is a radiation detector 18 that may be used with imaging system 10 (shown in FIG. 1). Radiation detector 18 includes a substrate 20 on which a pixel array 22 (sometimes called a photosensor array) is disposed. In one embodiment, photosensor array 22 includes a plurality of electronic components, such as capacitors 24, photodiodes 26, and switching devices 28, such as TFTs. TFTs 28 are disposed on array 22 to selectively couple a respective capacitor 24 and photodiode 26 to a respective data line 30. In another embodiment, photosensor array 22 does not include capacitor 24. Photosensor array 22 also includes a plurality of scan lines 32 for addressing a plurality of individual pixels 34. Data lines 30 are oriented along a first axis 36 of pixel array 22, and scan lines 32 are oriented along a second axis 38 of pixel array 22. First and second axes, 36 and 38, of pixel array 22, are disposed substantially perpendicular to each other.

For ease of illustration in FIG. 2, only a few of data lines 30, scan lines 32, and common lines 40 are shown extending across photosensor array 22. Data lines 30, scan lines 32, and common lines 40 are arranged in rows and columns such that individual pixels 34 in photosensor array 22 are addressable by one data line 30, one scan line 32, and one common line 40. Data lines 30, scan lines 32, and common lines 40 include a conductive material, such as molybdenum, chromium, and/or aluminum. Capacitors 24 are electrically parallel connected to photodiodes 26, and are electrically coupled to data lines 30 through TFTs 28. Photodiodes 26 form the portion of array 22 that is responsive to incident photons and produce electric charge corresponding to a detected incident light. X-ray energy is converted to visible light energy by absorption in a layer of phosphor (not shown), such as cesium iodide, which is disposed near the surface of photodiodes 26. Capacitors 24 store a charge generated in photodiode 26 and discharge this stored charge through TFT 28 when scan line 32 is addressed. Some charge is also stored on the self-capacitance of photodiode 26.

Figure 3:
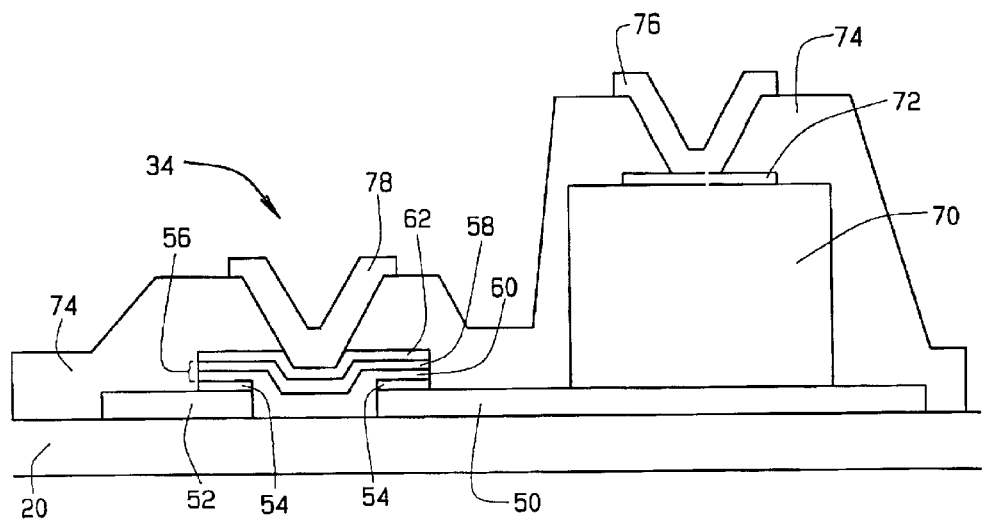
FIG. 3 is a cross-sectional view of a portion of a pixel of a radiation detector.

FIG. 3 is a cross-sectional view of a portion of pixel 34 formed on substrate 20. In an exemplary embodiment, all semiconductive layers and dielectric layers described herein are deposited by plasma enhanced chemical vapor deposition (PECVD). Pixel 34 includes a source/diode electrode 50 and a drain electrode 52 extending over a surface of substrate 20 such that source/diode electrode 50 and drain 52 are approximately equal in thickness.

In one embodiment, an n+ doped semiconductor layer 54 is formed on source/diode electrode 50 and drain electrode 52. N+ doped semiconductor layer 54 can be formed by one of several methods described herein. N+ doped semiconductor layer 54 is deposited, patterned, and etched to achieve the desired shape. In another embodiment, a suitable material such as indium tin oxide (ITO) is used to form source/diode electrode 50 and drain electrode 52. The ITO is then exposed to a phosphorous plasma or other active gas containing phosphorous, prior to deposition of a substantially intrinsic amorphous silicon layer.

A TFT stack 56 is then formed on substrate 20. TFT stack 56 includes a dielectric layer 58 extending over a surface of a layer of semiconductive material 60, such as intrinsic amorphous silicon (a-Si). In one embodiment, intrinsic a-Si layer 60 is formed on n+ doped semiconductor layer 54 and between source/diode electrode 50 and drain electrode 52. In another embodiment, n+ doped semiconductor layer 54 is not formed and intrinsic a-Si layer 60 is formed directly on and between source/diode electrode 50 and drain electrode 52. Dielectric layer 58 is then formed over a-Si layer 60. As used herein, "formed" includes processes to fabricate each component of pixel 34, including, but not limited to, patterning, masking, depositing, and etching. A gate electrode 62 is then formed on dielectric layer 58. After patterning and etching of TFT stack 56 and gate electrode 62, a diode stack 70 is formed on source/diode electrode 50.

In one embodiment, diode stack 70 includes a PIN diode. A PIN diode includes a layer of p+ material deposited on a layer of intrinsic a-Si which is deposited on a layer of n+ material. In one embodiment, a diode top contact 72 is deposited, patterned, and etched on diode stack 70. In an alternative embodiment, diode top contact 72 is not formed. A passivation layer 74 is formed over diode top contact 72, diode stack 70, and exposed portions of gate electrode 62, source/diode electrode 50 and drain electrode 52. A plurality of contact vias are then opened in passivation layer 74 at the desired locations. A common via 76 is formed such that common via 76 is electrically connected to diode top contact 72, or alternatively to diode stack 70. A gate via 78 is formed such that gate electrode 62 is electrically coupled to scan line 32 (shown in FIG. 2). A contact via is defined as a hole in the passivation layer exposing a lower conductor. A via is defined as the entire structure including the metal layer and the contact via hole making contact to the lower conductor.

Figure 4:
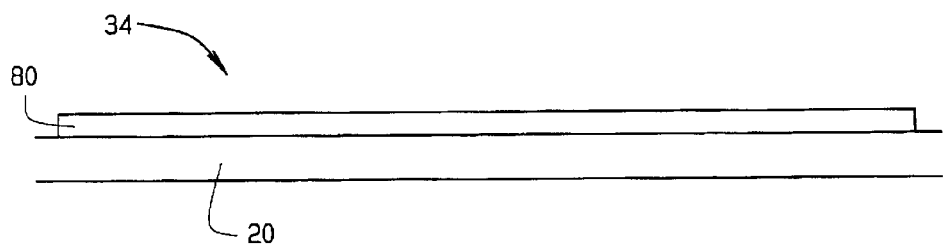
FIG. 4 is a cross-sectional view of a portion of the pixel shown in FIG. 3 during an initial fabrication stage.
Figure 5:
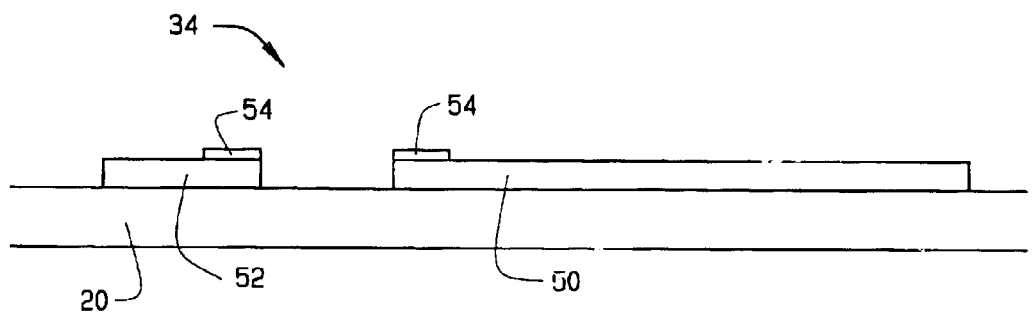
FIG. 5 is a cross-sectional view of a portion of the pixel shown in FIG. 3 during a first subsequent fabrication stage.

FIGS. 4 and 5 are cross-sectional views of a portion of pixel 34 shown in FIG. 3 during an initial fabrication stage and a first subsequent fabrication stage respectively. Semiconductor and dielectric layers are deposited by plasma enhanced chemical vapor deposition (PECVD). In an exemplary embodiment, a first metallic layer 80 is deposited, patterned, and etched to form source/diode electrode 50, drain electrode 52, and data line 30 (shown in FIG. 2) unitary with drain electrode 52. The patterning process includes, but is not limited to, depositing a photoresist, exposing the photoresist in accordance with a desired pattern, and processing photoresist to remove portions thereof, leaving a mask having a selected pattern corresponding to desired dimensions. In one embodiment, the thickness of first metallic layer 80 is between approximately 100 angstroms(Å) and approximately 3000 Å thick. In another embodiment, first metallic layer 80 is approximately 400 Å. Alternatively, first metallic layer 80 is between approximately 200 Å and approximately 600 Å thick. First metallic layer 80 may include, but is not limited to, aluminum, chromium, and/or molybdenum.

N+ a-Si layer 54 is then deposited, patterned and etched or co-deposited patterned and etched to form an n+ layer on top of source/diode electrode 50 and drain electrode 52. N+ a-Si layer 54 forms an ohmic electron contact and a blocking or non-injecting contact for holes. An ohmic contact facilitates supplying electron charge carriers to a semiconductor at a rate determined by charge transport through the semiconductor and not by the contact properties itself, therefore, current is limited by the conductivity of the semiconductor electron channel and not the contact. N+ a-Si layer 54 is patterned and etched to expose source/diode 50 and drain electrode 52. In one embodiment, the thickness of n+ a-Si layer 54 is between approximately 100 Å and approximately 3000 Å thick. In another embodiment, n+ a-Si layer 54 is approximately 400 Å. Alternatively, n+ a-Si layer 54 is between approximately 200 Å and approximately 600 Å thick.

In another exemplary embodiment, a suitable material such, but not limited to, an indium tin oxide (ITO) is used to form source/diode electrode 50 and drain electrode 52. When using the ITO layer, source/diode electrode 50 and drain electrode 52 are selectively treated with a silicon dopant (not shown) such as, but not limited to, phosphine plasma, prior to depositing a-Si layer 60 (shown in FIG. 3). Silicon dopant reacts with source/diode electrode 50 and drain electrode 52 to selectively incorporate a phosphorous material (not shown) on the surface of source/diode electrode 50 and drain electrode 52, and thereby modify TFTs 28 (shown in FIG. 2) electrical behavior and improve ohmic contact between source/diode electrode 50, drain electrodes 52, and a-Si layer 60. The ITO layer absorbs some phosphorous and subsequently liberates this phosphorous into the adjacent regions of layer 60 producing an n+doped semiconductor layer.

Figure 6:
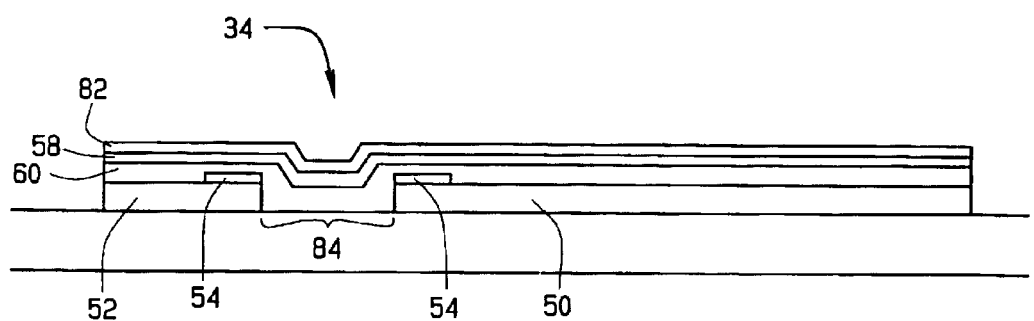
FIG. 6 is a cross-sectional view of a portion of the pixel shown in FIG. 3 during a second subsequent fabrication stage.

FIG. 6 is a cross-sectional view of a portion of pixel 34 shown in FIG. 3 during a second subsequent fabrication stage. During fabrication, a-Si layer 60 is deposited on exposed portions of source/diode electrode 50, drain electrode 52, and N+ a-Si layer 54. Alternatively, a-Si layer 60 is deposited on exposed portions of source/diode electrode 50 and drain electrode 52 if ITO is used. In one embodiment, the thickness of a-Si layer 60 is between approximately 100 Å and approximately 3000 Å thick. In another embodiment, a-Si layer 60 is approximately 400 Å. Alternatively, a-Si layer 60 is between approximately 200 Å and approximately 600 Å thick.

Dielectric layer 58 is deposited on a-Si layer 60. In one embodiment, the thickness of dielectric layer 58 is between approximately 100 Å and approximately 500 Å thick. In another embodiment, dielectric layer 58 is approximately 400 Å thick. Alternatively, dielectric layer 58 is between approximately 50 Å and approximately 700 Å thick. Dielectric layer 60 includes, but is not limited to, SiN.

A second metallic layer 82, which facilitates blocking light from an active TFT region 84, is deposited, in a single metallization step, on dielectric layer 58. During metallization, a metallic material is deposited by sputtering or is deposited by evaporating a thin layer of a metallic material. Alternatively, the metallic material is deposited other than by sputtering or evaporating. Second metallic layer 82 may include, but is not limited to, aluminum, chromium, and/or molybdenum. In one embodiment, the thickness of second metallic layer 82 is between approximately 100 Å and approximately 3000 Å thick. In another embodiment, second metallic layer 82 is approximately 400 Å thick. Alternatively, second metallic layer 82 is between approximately 200 Å and approximately 600 Å thick.

Figure 7:
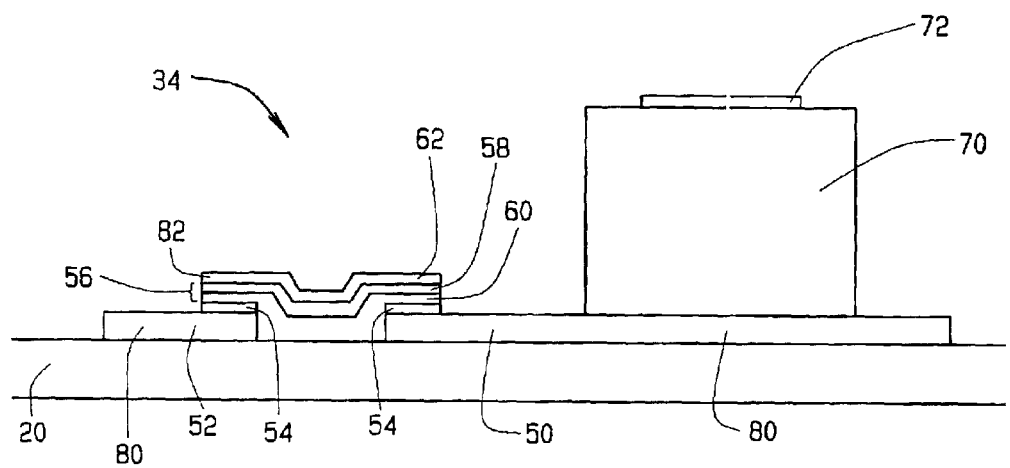
FIG. 7 is a cross-sectional view of a portion of the pixel shown in FIG. 3 during a third subsequent fabrication stage.

FIG. 7 is a cross-sectional view of a portion of pixel 34 shown in FIG. 3 during a third subsequent fabrication stage. N+ a-Si layer 54, a-Si layer 60, dielectric layer 58, and second metallic layer 82 are patterned and etched such that a-Si layer 60 is approximately coextensive with dielectric layer 58, and dielectric layer 58 is approximately coextensive with gate electrode 62. This TFT stack and gate metal etching process stops when first metallic layer 80 is contacted.

Following the gate metal etch, diode stack 70 is deposited on source/diode electrode 50 without any intervening patterning step. In one embodiment, diode top contact 72 is deposited on diode stack 70. Diode top contact 72 is formed from a transparent conductor such as ITO. Diode stack 70 and diode top contact 72 are patterned and etched. The same mask may be used to first wet etch, or alternatively, dry etch diode top contact 72, followed by a dry etching of diode stack 70. Alternatively, two separate masking steps can be used to form diode top contact 72, smaller than diode stack 70, followed by patterning and etching diode stack 70.

Figure 8:
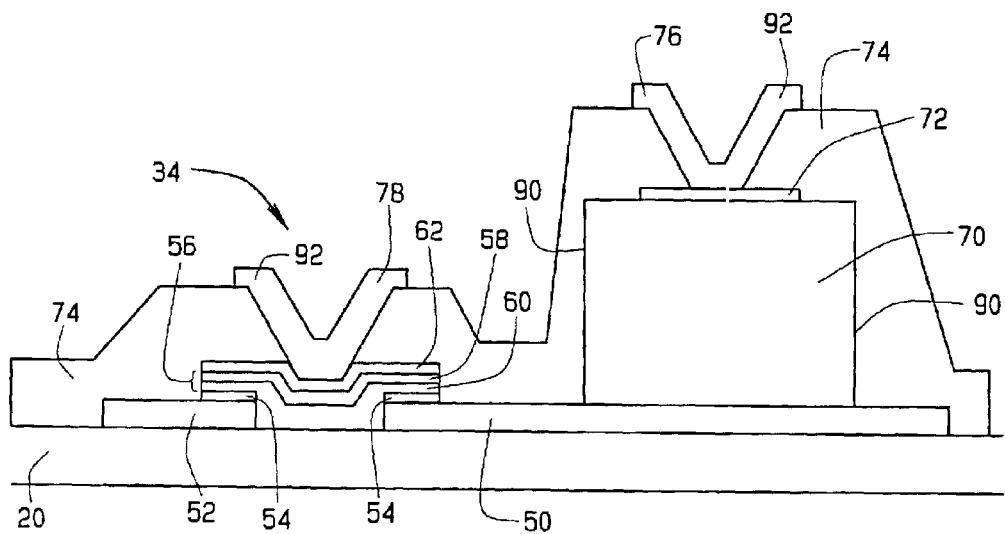
FIG. 8 is a cross-sectional view of a portion of the pixel shown in FIG. 3 during a fourth subsequent fabrication stage.

FIG. 8 is a cross-sectional view of a portion of pixel 34 shown in FIG. 3 during a fourth subsequent fabrication stage. During fabrication, passivation layer 74 is deposited over pixel 34. Passivation layer 74 is then etched to expose diode top contact 72. Passivation layer 74 is relatively thick, between 0.2 microns ($\mu$) to 1.0$\mu$ and may be formed from material such as, but not limited to, silicon nitrile and silicon oxide. Passivation layer 74 facilitates protecting a plurality of diode sidewalks 90 against mechanical and chemical damage in subsequent processing.

A third metallic layer 92 is deposited on passivation layer 74 to form common via 76 and gate via 78. Gate via 78 electrically couples gate electrode 62 to scan line 32 (shown in FIG. 2). Common via 76 and gate via 78 are formed in one etching step to provide access through a portion of passivation layer 74 (i.e. common via 76 and gate via 78 are surrounded on all sides by remaining portions of common passivation layer 74) such that electrical contact can be made to underlying components.

In an exemplary embodiment, pixel 34 can be fabricated in the processing steps described herein, and allows aluminum metallization, which is desirable for low resistance lines. Metallic gate electrode 62 does not contact a-Si layer 60 directly so no special processes or barrier metal is used in the process. Further, first metallic layer 80 forms data line 30 (shown in FIG. 2) and common electrode 76. Also, no high temperature processes follows the aluminum deposition process, reducing the chance of forming aluminum hillocks (not shown), which may cause shorts. Finally, a barrier dielectric layer (not shown) is deposited over pixel 34, patterned and etched, to expose contact pads (not shown). The barrier dielectric layer may include, but is not limited to silicon nitrile.

Inverting the TFT structure to form a top-gate staggered structure as described herein facilitates blocking light from the active TFT regions since the gate metal serves as both the gate of the TFT and also as a light blocking layer for the channel region.

While the invention has been described in terms of various specific embodiments, those skilled in the art will recognize that the invention can be practiced with modification within the spirit and scope of the claims.

What is claimed is:

1. A radiation detector comprising:
   a top-gate thin film transistor (TFT) comprising a source electrode formed on a substrate, a drain electrode, and a gate electrode; and
   a diode electrically coupled to said source electrode, said diode comprising an electrode formed on the substrate.

2. A radiation detector in accordance with claim 1 wherein said gate electrode is configured such that light is substantially blocked from a TFT channel region.

3. A radiation detector in accordance with claim 1 wherein said TFT further comprises:
   an n+ a-Si silicon layer deposited on said source electrode and said drain electrode; and
   an intrinsic amorphous silicon layer extending over a surface of said n+ a-Si silicon layer.

4. A radiation detector in accordance with claim 3 wherein said TFT further comprises:
   a dielectric layer deposited on said intrinsic amorphous silicon layer such that said dielectric layer is approximately coextensive with said intrinsic amorphous silicon layer; and
   a gate electrode deposited on said dielectric layer such that said gate electrode is approximately coextensive with said dielectric layer.

5. A radiation detector in accordance with claim 1 wherein said TFT further comprises an intrinsic amorphous silicon layer extending over a surface of said source electrode and said drain electrode.

6. A radiation detector in accordance with claim 1 wherein said radiation detector further comprises a diode stack electrically coupled to said source electrode.

7. A radiation detector comprising:
   a top-gate thin film transistor (TFT) comprising an n+ a-Si silicon layer deposited on a source electrode and a drain electrode;
   an intrinsic amorphous silicon layer extending over a surface of said n+ a-Si silicon layer;
   a dielectric layer deposited on said intrinsic amorphous silicon layer such that said dielectric layer is approximately coextensive with said intrinsic amorphous silicon layer;
   a gate electrode deposited on said dielectric layer such that said gate electrode is approximately coextensive with said dielectric layer; and
   a diode electrically coupled to said source electrode.

8. An imaging system comprising: a radiation source; and a radiation detector positioned to receive radiation from said radiation source, said radiation detector comprising:
   a top-gate thin film transistor (TFT) comprising a source electrode formed on a substrate, a drain electrode, and a gate electrode; and
   a diode electrically coupled to said source electrode, said diode comprising an electrode formed on the substrate.

9. An imaging system in accordance with claim 8 wherein said gate electrode is configured such that light is substantially blocked from a TFT channel region.

10. An imaging system in accordance with claim 8 wherein said TFT further comprises:
   an n+ a-Si silicon layer deposited on a source electrode and a drain electrode; and
   an intrinsic amorphous silicon layer extending over a surface of said n+ a-Si silicon layer.

11. An imaging system in accordance with claim 10 wherein said TFT further comprises:
   a dielectric layer deposited on said intrinsic amorphous silicon layer such that said dielectric layer is approximately coextensive with said intrinsic amorphous silicon layer; and
   a gate electrode deposited on said dielectric layer such that said gate electrode is approximately coextensive with said dielectric layer.

12. An imaging system in accordance with claim 8 wherein said TFT further comprises an intrinsic amorphous silicon layer extending over a surface of said source electrode and said drain electrode.

13. An imaging system in accordance with claim 8 wherein said detector further comprises a diode stack electrically coupled to said source electrode.

14. An imaging system comprising: a radiation source; and a radiation detector positioned to receive radiation from said radiation source, said radiation detector comprising:
   a top-gate thin film transistor (TFT) comprising an n+ a-Si silicon layer deposited on a source electrode and a drain electrode;
   an intrinsic amorphous silicon layer extending over a surface of said n+ a-Si silicon layer;
   a dielectric layer deposited on said intrinsic amorphous silicon layer such that said dielectric layer is approximately coextensive with said intrinsic amorphous silicon layer;
   a gate electrode deposited on said dielectric layer such that said gate electrode is approximately coextensive with said dielectric layer; and
   a diode electrically coupled to said source electrode.

15. A method for fabricating an imaging array, said method comprising:
   forming a top-gate thin film transistor (TFT) including a source electrode formed on a substrate, a drain electrode formed on the substrate, and a gate electrode; and
   forming a diode electrode on the substrate such that said diode electrode is electrically coupled to the source electrode.

16. A method in accordance with claim 15 wherein said forming a TFT further comprises forming the gate electrode such that light is substantially blocked from a TFT channel region.

17. A method in accordance with claim 15 further comprising:
   forming an n+ a-Si silicon layer on the source electrode and the drain electrode; and
   forming an intrinsic amorphous silicon layer extending over a surface of the n+ a-Si silicon layer.

18. A method in accordance with claim 15 further comprising:
   forming a dielectric layer on the intrinsic amorphous silicon layer such that the dielectric layer is approximately coextensive with the intrinsic amorphous silicon layer; and
   forming a gate electrode on the dielectric layer such that the gate electrode is approximately coextensive with the dielectric layer.

19. A method in accordance with claim 15 further comprising forming a diode stack electrically coupled to the source electrode.

20. A method for fabricating a detector array, said method comprising:
   forming a top-gate thin film transistor (TFT) including a source electrode, a drain electrode, and a gate electrode, wherein the TFT includes a dielectric layer deposited on an intrinsic amorphous silicon layer such that the dielectric layer is approximately coextensive with the intrinsic amorphous silicon layer and a gate electrode deposited on the dielectric layer such that the gate electrode is approximately coextensive with the dielectric layer; and
   forming a diode electrically coupled to the source electrode.

* * * * *

UNITED STATES PATENT AND TRADEMARK OFFICE
CERTIFICATE OF CORRECTION

PATENT NO.   : 6,777,685 B2
DATED        : August 17, 2004
INVENTOR(S)  : Ji Ung Lee It is certified that error appears in the above-identified patent and that said Letters Patent is hereby corrected as shown below:

Column 7,
Line 39, delete "agate" and insert therefor -- a gate --.

Signed and Sealed this

Thirtieth Day of August, 2005

JON W. DUDAS
*Director of the United States Patent and Trademark Office*